Dec. 29, 1970 J. C. GREESON, JR 3,551,836

DIFFERENTIAL AMPLIFIER CIRCUIT ADAPTED FOR MONOLITHIC FABRICATION

Filed Jan. 17, 1968 3 Sheets-Sheet 1

INVENTOR

JAMES C. GREESON, JR.

BY John C Black

ATTORNEY

United States Patent Office 3,551,836

Patented Dec. 29, 1970

3,551,836

DIFFERENTIAL AMPLIFIER CIRCUIT ADAPTED FOR MONOLITHIC FABRICATION

James C. Greeson, Jr., Woodstock, N.Y., assignor to International Business Machines Corporation, Armonk, N.Y., a corporation of New York Filed Jan. 17, 1968, Ser. No. 698,594
Int. Cl. H03f *3/10, 3/68*
U.S. Cl. 330—30 5 Claims

ABSTRACT OF THE DISCLOSURE

An improved amplifier achieves greater dynamic range than existing amplifiers with no sacrifice in common mode rejection. The amplifier includes first and second differential amplifying stages. A reference voltage is set by supplying constant current to two series-connected diodes which are in the form of transistors having their base-collector electrode short-circuited. The total collector current from the second stage produces a voltage drop across a third diode in the form of a transistor having its base and collector electrodes short-circuited. A single transistor amplifier compares the voltage across the third diode with the reference voltage to supply current to the first stage at a level which is an inverse function of the second stage collector current. The diodes and the single transistor amplifier have substantially matched base-emitter voltage-current characteristics to establish accurate and stable operating current relationships. Collector return is provided for the first stage by transistors whose current is determined by one or more diodes, each in the form of a transistor having its base and collector electrodes short-circuited, current being supplied to the latter diodes by the same source that supplies current to the first two diodes. The latter transistors and diodes have substantially matched base-emitter voltage-current characteristics. This permits a dynamic range which is equal to the voltage supply differential minus approximately three diode voltage drops (e.g., each diode drop can be in the order of seven-tenths volt).

CROSS REFERENCE TO RELATED APPLICATIONS

Certain of the features of the present application are utilized in a different implementation in a first copending application of James C. Greeson, Jr., Ser. No. 698,650, filed of even date herewith. The basic structure is claimed per se herein and the more specific implementation is claimed in the copending application.

Also use is made in the preferred embodiment herein of a feature described and claimed generically in said first copending application.

The relationship between the applications will be identified more fully in the detailed description which follows.

BACKGROUND OF THE INVENTION

(1) Field of the invention

The present application is directed primarily to the field of analog circuits as contrasted with the field of digital circuitry. In particular, it is desired to provide small signal, linear amplifiers which are characterized by a maximum dynamic range, a minimum number of resistors and a reliable control of D.C. static operating currents for the various transistor amplifiers.

The improved circuit is particularly well adapted for construction on a single semiconductor chip by conventional monolithic techniques; and, in fact to some extent relies upon monolithic fabrication for optimum low-cost implementation, i.e., low-cost transistors with matched characteristics are more readily achieved in monolithically fabricated integrated circuit structures.

The improved amplifier permits minimum power supply levels which need not be accurately controlled and, therefore, minimizes the likelihood of transistor breakdown, permitting maximum geometry freedom in the fabrication. Power dissipation is reduced permitting smaller, less expensive packages for mounting the circuits. Since the total number and value of the resistor elements are kept at a minimum, the chip size for a given circuit can be reduced increasing the yield for a given wafer. Alternatively, the one or few resistors which are required can now be discrete elements removed from the chip without unduly increasing the number of semiconductor chip terminals required.

In the improved operational amplifier application, high common mode rejection is provided and high input and output dynamic range is achieved.

(2) Description of the prior art

The amplifier of the present application makes use of the teachings of copending United States patent application Ser. No. 513,395 of R. Ordower, filed Dec. 13, 1965, for a "Transistor Amplifier with Gain Stability," issued July 9, 1968, as U.S. Pat. No. 3,392,342; and said copending application is incorporated herein by reference. Said copending application teaches the use of one or more diodes in the form of transistors having their base-collector electrode shorted and connected across the base-emitter electrodes of a transistor amplifier to control the gain of the amplifier. The diodes and the transistor amplifier must have base-emitter voltage-current characteristics matched as perfectly as practical to provide a current gain in the collector electrode of the transistor amplifier which is an inverse function of the number of diodes connected across base-emitter electrodes of the transistor amplifier. For example, one diode provides a gain of one, two diodes a gain of one-half, three diodes a gain of one-third, etc.

The amplifier of the present application makes use of this basic principle to effect further improvements in linear amplifiers and particularly in what are referred to commonly as operational amplifiers, e.g., for example, that described in a second copending application of James C. Greeson, Jr., Ser. No. 491,962, filed Oct. 1, 1965 entitled "Monolithically Fabricated Operational Amplifier Device with Self Drive," issued Mar. 25, 1969 as U.S. Pat. No. 3,435,365.

When two differential amplifier stages are cascade connected, it is desirable to control by feedback means the sum of the collector currents in the second amplifier as described in said second copending application of James C. Greeson, Jr. This is important in order to achieve good dynamic swing at the output while maintaining linearity. Another benefit is the improved common mode rejection which is achieved by the feedback means.

In the patent of James C. Greeson, Jr., the feedback control is provided by causing the sum of the collector currents of the second stage to pass through a resistor producing a voltage drop. This voltage drop is compared with a reference voltage by means of an amplifier. This latter amplifier supplies a current to the first stage, the magnitude and polarity of which is proportional to the difference between the voltages. The first stage is coupled to the second stage with the proper polarity relationship such that changes in the sum of the currents in the collectors of the second stage are effectively suppressed. Common mode rejection is a measure of the effect that "in-phase" signals applied to the base input of the first stage have on the sum and difference of the current flowing in the second stage.

SUMMARY OF THE INVENTION

The term "diode" as used hereinafter refers to a transistor having its base-collector electrodes short-circuited.

It is a primary object of the present invention to provide an improved linear differential amplifier which is particularly well adapted for monolithic fabrication on a single semiconductor chip, which exhibits high common mode rejection, minimum power dissipation, minimum number of resistors and minimum total resistance, maximum dynamic range, and minimum power supply levels.

This object is achieved in a preferred embodiment by providing a differential amplifier having first and second stages. The first stage includes a pair of transistors connected in the form of a differential amplifier having their emitter electrodes connected to a current source in the form of a series-connected transistor amplifier and a first diode. Second and third series-connected diodes are connected across the series circuit comprising the base-emitter junction of the transistor amplifier and the first diode.

The three diodes and the transistor amplifier have substantially matched base-emitter voltage-current characteristics.

The second and third diodes are further connected in series with a resistor which determines the value of the current through the diodes. This current flowing through the second and third diodes establishes a reference voltage for the current source, thereby in part determining the value of the D.C. static operating current supplied by the transistor amplifier to the emitters of the first stage of the differential amplifier.

The second stage differential amplifier has its total collector current fed back to the junction between the transistor amplifier and the first diode, establishing a voltage across the diode as a function of the feedback current level. The transistor amplifier compares this voltage with the reference voltage at its base electrode and supplies emitter current to the first stage as a function of the difference between the voltages, thereby establishing a stable operating point for the differential amplifier and providing reliable common mode rejection. Additional diodes can be connected in parallel with the first diode, permitting a reduction in the current flowing through the second and third diodes by a factor equal to the square root of the number of parallel diodes provided while maintaining the relationship between the current supplied to the emitters of the first stage and that supplied by the feedback current.

One or more fourth diodes are connected across the base-emitter electrodes of two transistor current sources, each associated with a respective collector electrode of the first stage of the differential amplifier. The current flowing through the fourth diodes is set by the above-described resistor and sets the base voltage for the latter current sources to determine the D.C. static operating current levels for the collectors of the first stage differential amplifier.

The foregoing and other objects, features and advantages of the invention will be apparent from the following more particular description of preferred embodiments of the invention, as illustrated in the accompanying drawings.

DESCRIPTION OF THE PREFERRED EMBODIMENTS

Figure 1:
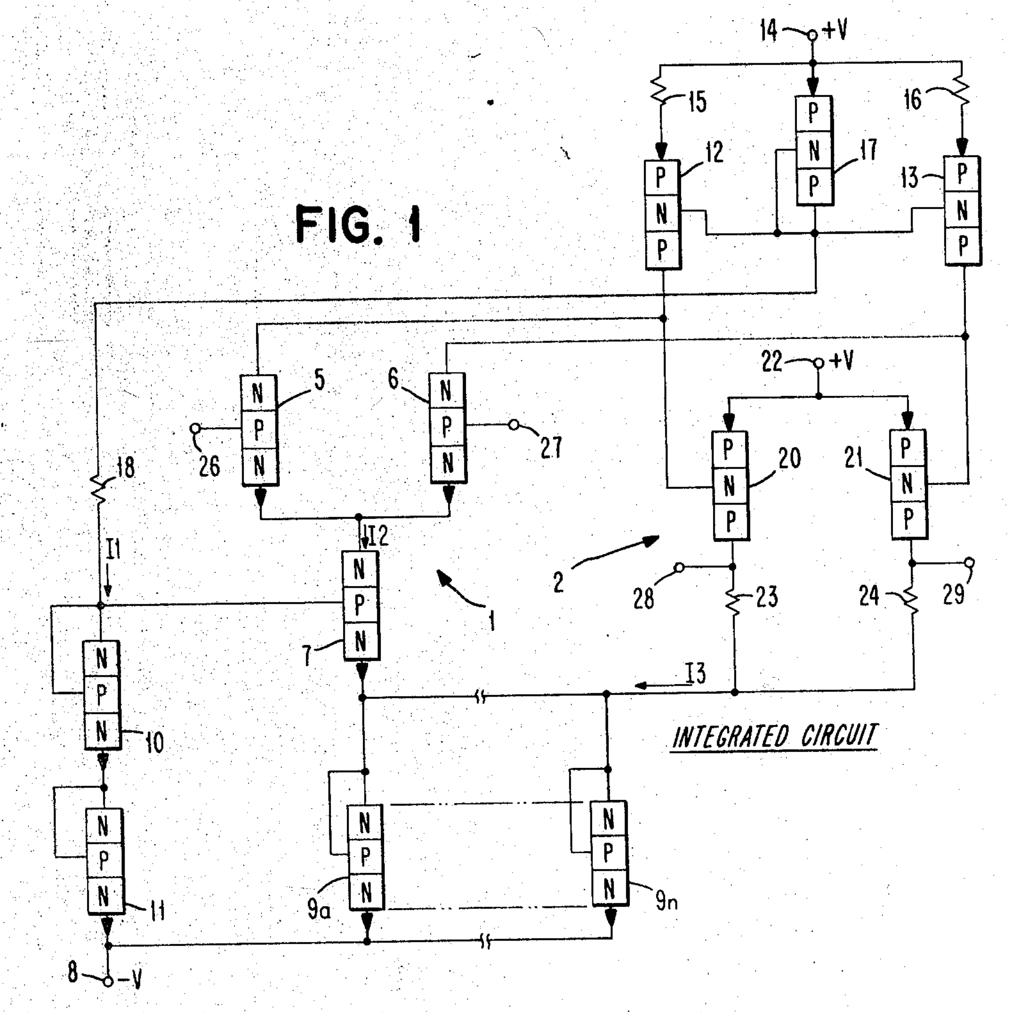
FIG. 1 is a schematic diagram of one embodiment of the improved amplifier.

The improved amplifier of FIG. 1 includes a first differential amplifier stage 1 and a second cascade-connected differential amplifier stage 2. Stage 1 includes a pair of NPN transistors 5 and 6 having their emitter electrodes connected to a current source in the form of an NPN transistor 7.

The emitter electrode of the transistor 7 is connected to a negative supply terminal 8 by way of one or more NPN diodes **9*a*–9*n*. The base electrode of the transistor 7 is connected to the terminal 8 by way of a pair of series-connected NPN diodes 10 and 11**.

The collector electrode of the transistor 5 is connected to a current source in the form of a PNP transistor 12 and the collector electrode of the transistor 6 is connected to a current source in the form of a PNP transistor 13.

The emitter electrode of the transistor 12 is connected to a positive supply terminal 14 by way of a resistor 15. The emitter electrode of the transistor 13 is connected to the terminal 14 by way of a resistor 16.

A PNP diode 17 is connected between the terminal 14 and the base electrodes of the transistors 12 and 13 to determine the level of the current supplied by the transistors 12 and 13 to the collector electrodes of the transistors 5 and 6. A resistor 18 is connected in series with the diodes 10, 11 and 17 and determines the level of the currents flowing through said diodes.

Stage 2 comprises a pair of PNP transistors 20 and 21 having their emitter electrodes connected to a positive supply terminal 22 and having their collector electrodes connected to the junction between the diode **9*a* and the emitter electrode of the transistor 7 by way of resistors 23 and 24** respectively.

Input signals to the amplifier are applied to terminals 26 and 27 and output signals are derived from terminals 28 and 29.

The operating point stability of the first and second differential stages is achieved by means including transistor 7. The transistor 7 compares the voltage produced at its emitter electrode by feedback current from the second stage flowing in the diodes **9*a*–9*n* with a fixed reference voltage produced at its base electrode by bias current flowing through the diodes 10 and 11. The result of this voltage comparison provides operating current for the first stage transistors 5 and 6**.

This feedback loop which exists between the second and first differential amplifying stages enhances the common mode rejection significantly. The common mode rejection of the first differential stage is further enhanced by reason of the fact that the collector-return devices 12 and 13 have their current levels set by the same current source, e.g., resistor 18, as the reference potential set by the diodes 10 and 11.

For example, assume that the total operating current level in the emitter electrodes of the transistors 5 and 6 tends to decrease. Since the current delivered to the collector nodes by the transistors 12 and 13 is constant, the base currents of the transistors 20 and 21 will decrease. This causes a decrease in the total collector current delivered by the transistors 20 and 21 to the diode **9*a*. This decrease in current causes the voltage across the diode 9*a* to decrease, causing a corresponding increase in the current delivered to the emitter electrodes of the transistors 5 and 6 by the transistor 7**, thus tending to stabilize the operating point of the differential amplifier.

The second stage differential amplifier comprising the transistors 20 and 21 is unique in that the common mode repection ratio of this stage, independent of the total feedback configuration, is unity. Note that the emitter electrodes of the transistors 20 and 21 are connected directly to the positive supply terminal 22; this is feasible because of the configuration of the collector return devices of the first stage. The only guarantee that the transistors 20 and 21 operate with currents whose sum is constant is the use of the feedback comparison between the base and emitter electrode voltages of the transistor 7. Without this arrangement, part of the output dynamic range of the amplifier must be sacrificed by the insertion of a resistor between the emitter electrode of the transistors 20 and 21 and the positive supply terminal 22.

The use of the matched semiconductor "Quad" allows the input dynamic range of the amplifier to be further increased. This "Quad" comprising the diodes 9, 10 and 11 and the transistor 7 comprises no resistive elements, whereby the dynamic range of the input or first stage of the amplifier can be as low as three diode drops more positive than the negative supply at the terminal 8. The arrangement of the diode 17 and the transistor amplifiers 12 and 13 permits the dynamic range to be extended in the positive direction to approximately the positive supply at the terminal 14.

A more detailed description of the phenomenon used to achieve the improved amplifier of FIG. 1 will now be described, reference being directed to the fragmentary views shown in FIGS. 2*a*–2*e* inclusive.

Figure 2A:
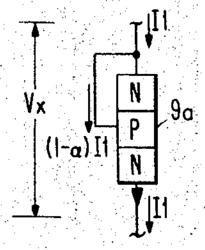
FIGS. 2*a*–2*e* are fragmentary schematic diagrams illustrating the manner in which various portions of the improved circuit of FIG. 1 operate.
Figure 2B:
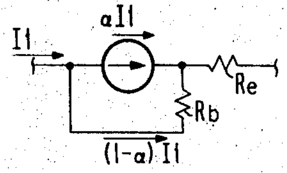

FIGS. 2*a* and 2*b* show certain characteristics of a transistor having its base-collector electrodes short-circuited to act as a diode and its equivalent circuit. The voltage $Vx$ across the diode is set substantially in accordance with the following equation:

$$I1=Is\ (e^{40Vx}-1)$$

Let $Is=e^{-40Vo}$ where $Vo$ is the potential at the base electrode with respect to the emitter electrode when the emitter current is one milliampere.

Then $$I1=e^{40(Vx-Vo)}-e^{-40Vo}$$

Since the factor $e^{-40Vo}$ is approximately equal to forty-nine nanoamps, it can be disregarded and the diode equation may be written in the following approximation form:

$$I1=e^{40(Vx-Vo)}$$

or $$\text{Log } I1=40^{(Vx-Vo)}$$

or $$Vx=\frac{1}{40}\log I1+Vo$$

Figure 2E:
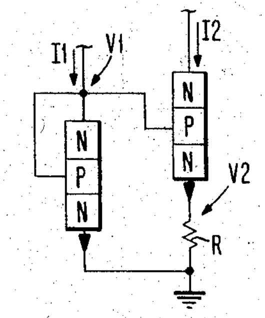
Figure 2D:
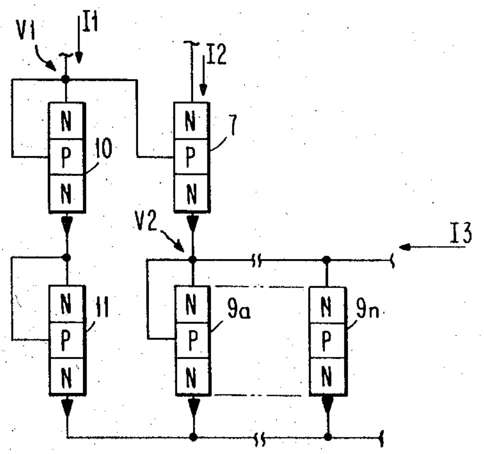
Figure 2C:
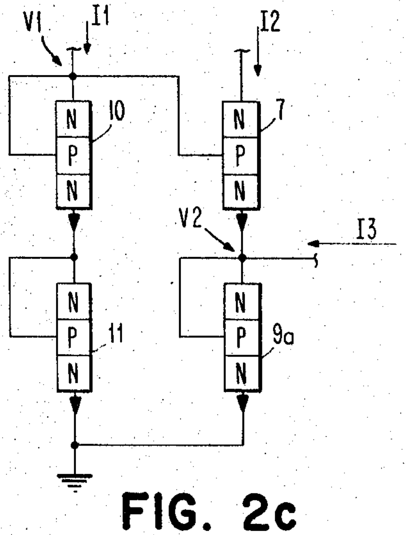

The key idea exploited in the improved amplifier of FIG. 1 is the application of these diode equations in monolithic technology, particularly in the application of the equations to the "Quad" of FIG. 2*c* comprising transistors **9*a*, 10, 11 and 7**.

If we assume that $\alpha$ is extremely close to unity, i.e., base current transistor 7 is so small as to be neglected, the following equations may be written for the "Quad":

$$V1=2\left[\frac{1}{40}\log I1+Vo\right]$$

$$V2=\frac{1}{40}\log\ (I2+I3+Vo$$

$$I2=e^{40[V1-V2-Vo]}=e^{\log I1^2-\log(I2+I3)}=\frac{I1^2}{I2+I3}$$

or $$I2^2+I2I3-I1^2=0$$

where

V1 is the voltage across the diodes 10 and 11;
V2 is the voltage across the diodes **9*a***; and the currents I1, I2 and I3 are those illustrated in FIG. 2*c*.

These current relationships (ratios) are maintained constant by the "Quad" comprising the transistors 7, **9*a*, 10 and 11** independent of variations in power supply and, within limits, independent of temperature variations.

Referring again to the amplifier of FIG. 1, it will be noted that the currents I1, I2 and I3 of FIG. 2*c* are respectively the bias current through the diodes 10 and 11, the emitter current of the transistors 5 and 6 of the first differential amplifier stage 1 and the feedback current derived from the collector electrodes of the second stage differential amplifier. It will be appreciated, therefore, that the ratios of the emitter current set in the first stage by the transistor 7 and the collector current derived from the second stage with respect to the bias current level set by the resistor 18, will be maintained constant irrespective of the value of or variations in the supply potential. Thus the ratios of I1, I2 and I3 remain constant even though their values may change.

If additional transistors such as **9*n*** are incorporated in the amplifier of FIG. 1, the voltage-current relationships illustrated in FIG. 2*d* will be as follows:

$$V2=\frac{1}{40}\log\left[\frac{(I2+I3)}{n}\right]+V_0$$

and $$I2=\frac{nI1^2}{I2+I3}$$

Thus paralleling devices **9*a* to 9*n*** enables the designer to reduce the current I1 by a factor of the square root of $n$ while maintaining the I2 and I3 current relationships.

Referring to FIG. 2*e*, the following voltage-current relationships are established:

$$V1=\frac{1}{40}\log I1+V_0$$

$$V2=I2R$$

$$I2=e^{40(V1-V2-Vo)}$$

$$I2=I1e^{-40V2}$$

$$\frac{I2}{I1}=e^{-40I2R}$$

Although the equation immediately above is a relatively difficult analysis tool, it is an easy design tool. For example, let the relationship or ratio between I1 and I2 be as follows:

$$I2=\tfrac{1}{2}I1$$

This results in the following relationship:

$$e^{-40V2=\frac{1}{2}}$$

$$-40V2=\log \tfrac{1}{2}=-.693$$

Therefore, $V2=17.32$ millivolts. If we let $I2=$one/milliampere, then $R=17.32$ ohms.

These equations can be used for determining the values of resistors 15 and 16 of FIG. 1.

Referring to FIG. 1, the design of a suitable amplifier will now be described. Let it be assumed arbitrarily that the currents I2 and I3 are 1 and 2 units respectively. Utilizing the equation set forth above with respect to FIG. 2*d* using 2 diodes **9*a* and 9*n***, it will be determined that the current I1 will equal 1.225 units of current.

Assuming that the output terminals 28 and 29 are at ground potential, with no differential input signals at terminals 26 and 27, that a normal diode drop equals seven-tenths volt, and that the voltage at the terminal 8 equals minus eight volts, then the voltage across each resistor 23 and 24 is 7.3 volts. The current through each resistor equals one unit of current, i.e., one-half of I3. If one unit of current is one milliampere, the value of each resistor 23 and 24 equals the 7.3 volts divided by one milliampere or seventy-three hundred ohms.

The voltage across the bias resistor 18 is equal to sixteen volts (assuming that the potential at the terminal 14 is plus eight volts) less three diode drops of seven-tenths each, defined by the diodes 17, 10 and 11, or 13.9 volts. The current I1 through the resistor 18 has been defined above as 1.225 milliamperes; therefore, the resistance value for the resistor 18 should ve 13.9 volts divided by 1.225 milliamperes or 11,350 ohms.

The transistors 5 and 6 carry equal currents, that is, one-half of the current I2 or five-tenths milliamperes. As a result, each of the transistors 12 and 13 should also deliver five-tenths milliampere of current. However, the diode 17 carries the current I1 or 1.225 milliamperes of current. Utilizing the above equations, the voltage across each resistor 15 and 16 can be determined as follows:

$$\frac{.5}{1.225}=e^{-40V}$$

or $V+.0224$ volt. Dividing this voltage by the one-half milliampere of current flowing through the resistors 15 or 16, the resistive value equals 44.8 ohms.

Diode 17 and transistors 12, 13 control only the static bias currents in transistors 5, 6; that is, the current levels when no differential signals are applied to input terminals 26, 27, i.e., 26 and 27 are at ground potential. The voltage across diode 17 and the resistors 15, 16 bias transistors 12 and 13 to produce equal constant current outputs, .5 ma. in the example at pages 14 and 15. The current through the diode 17 is determined by the plus and minus eight volt levels at terminals 14 and 8, a value for resistor 18 of 11,350 ohms and each voltage drop across diodes 10, 11 and 17 being approximately seven-tenths volt col. 6, line 74. (Note that diode 17 is always conducting so long as voltages are applied to terminals 8 and 14.) In the example, the currents 12 and 13 have values respectively of one milliampere and two milliamperes. These current outputs from the transistors 12 and 13 (with no signal applied to the inputs 26, 27) are the collector return currents for the transistors 5 and 6 and when added together are equal to the one milliampere of current applied to the emitters of transistors 5 and 6 (12).

However, when differential signals are applied to the input terminals 26, 27, the collector currents of transistors 5 and 6 vary and these variations in current are reflected in the base-emitter currents of the second stage transistors 20, 21. The base-emitter junctions of the transistors 20, 21 are connected in parallel with the collector emitter circuits of transistors 12 and 13, respectively; and therefore supply additional current to the transistors 5 or 6 in response to input signals of one and the other polarity. It will be appreciated that the base currents of the transistors 20, 21 which are supplied to the collectors of the transistors 5 and 6 are very small in relation to the collector currents supplied by the transistors 12 and 13 and therefore may be ignored for the purposes of computing the levels of the bias currents supplied by transistors 12 and 13 and flowing through the collector emitter circuits of the transistors 5 and 6.

The "Quad" comprising the semiconductor devices 7, 9*a*, 10 and 11 is claimed per se herein. It is used in a different implementation as a high power driver circuit in said first copending application of Greeson, Jr. and is claimed therein only in combination with other necessary structural details.

Figure 3:
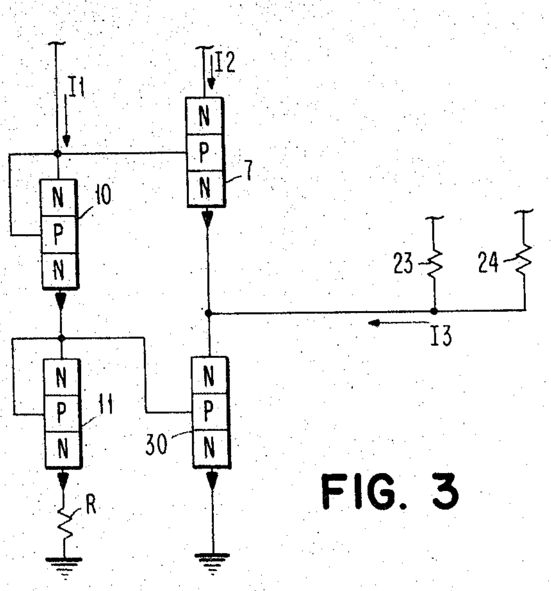
FIG. 3 is a fragmentary, schematic diagram illustrating a modification of the embodiment of FIG. 1.

The circuit of FIG. 1 may be modified as illustrated in FIG. 3 in order to increase the common mode loop gain of the amplifier. In this embodiment, an NPN transistor amplifier 30 is substituted for the diodes 9*a* to 9*n*. In addition, the junction between the diodes 10 and 11 is connected to the base electrode of the transistor 30. In this instance, the current relationships are as follows:

$$I2+I3=I1e^{40I1R}$$

where R is a resistor interposed between the diode 11 and ground potential.

Figure 4:
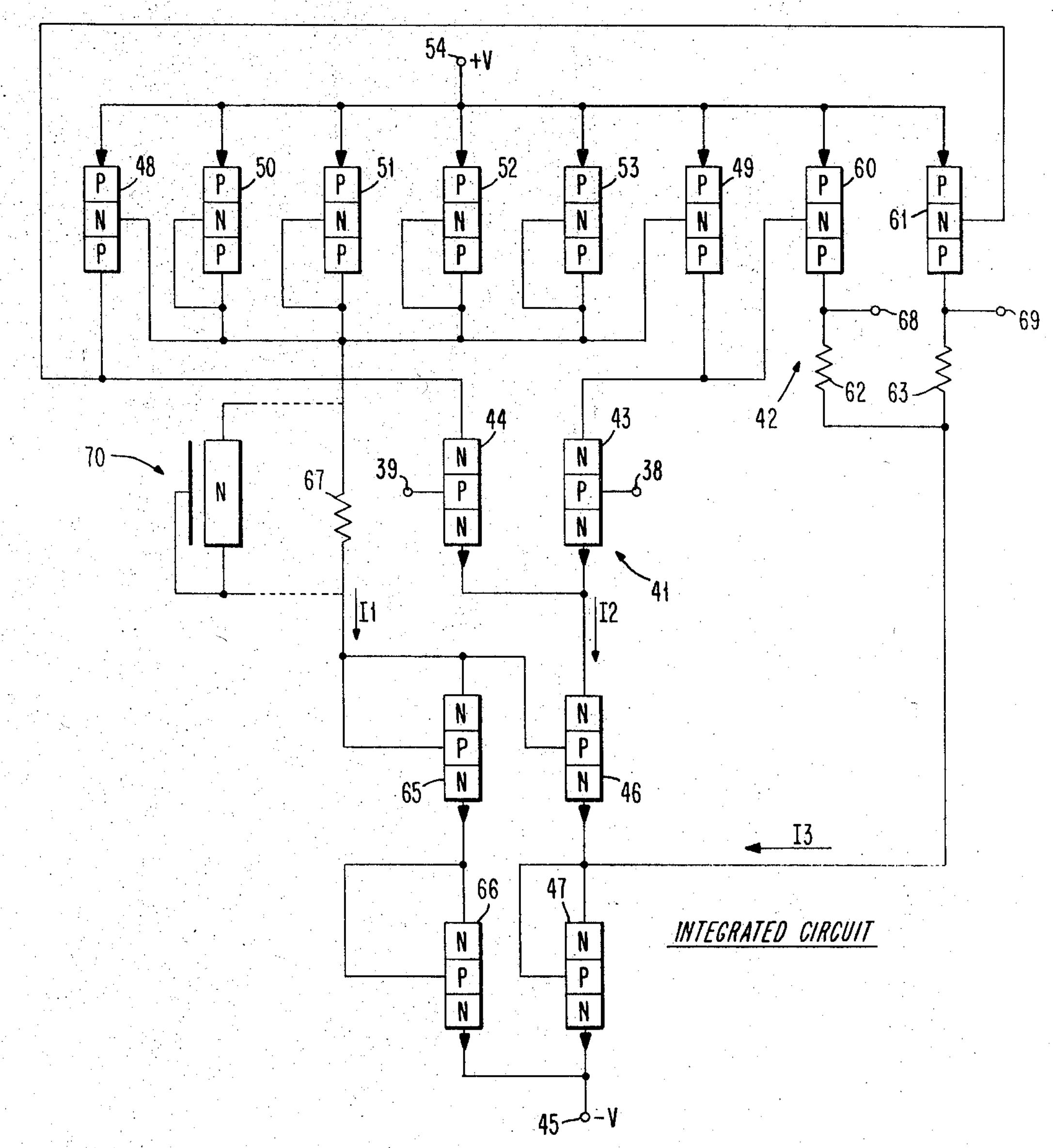
FIG. 4 is a schematic diagram of one preferred form of the improved amplifier.

FIG. 4 illustrates a preferred embodiment of the improved differential amplifier which obviates the need for resistors 15 and 16 of FIG. 1. Statements suggesting variations in FIG. 1 can be applied equally well to the embodiment of FIG. 4. The amplifier of FIG. 4 comprises first and second differential amplifying stages 41 and 42. The first stage comprises a pair of NPN transistors 43 and 44 having their emitter electrodes connected to a negative supply terminal 45 by way of an NPN transistor 46 and an NPN diode 47. Input signals are applied to the base electrodes of the transistors 43 and 44 via terminals 38 and 39. The collector electrode of the transistor 44 is connected to a positive supply terminal 54 by way of a common-emitter transistor amplifier 48 of the PNP type. The collector electrode of the transistor 43 is connected to the terminal 54 by a PNP common-emitter transistor amplifier 49. PNP diodes 50–53 inclusive are connected across the base-emitter electrodes of the transistor amplifiers 48 and 49.

The second stage 42 comprises a pair of PNP transistor amplifiers 60 and 61 having their emitter electrodes connected to the positive supply terminal 54. The base electrodes of the transistors 60 and 61 are connected respectively to the collector electrodes of the transistors 43 and 44. The collector electrodes of the transistors 60 and 61 are connected to the junction between the transistor 46 and the diode 47 by way of resistors 62 and 63 respectively. The base reference voltage for the transistor 46 is determined by a pair of series-connected NPN diodes 65 and 66 which are connected between the negative supply terminal 45 of a bias resistor 67. The other terminal of the resistor 67 is connected to the positive supply terminal 54 by way of the diodes 50–53 inclusive.

The current relationships are ratios established by the "Quad" comprising diodes 47, 65 and 66 and the transistor 46 are the same as those set forth with respect to the "Quad" of FIG. 1. The current relationships can be determined as follows.

Let it be assumed that the resistor 67 sets a current I1 of one unit. This one unit of current flows through the diodes 65 and 66 to set a predetermined reference voltage at the base of the transistor 46. This one unit of current is divided equally between the diodes 50–53, whereby each diode carries a current of one-fourth unit. These diodes in turn cause the transistor amplifiers 48 and 49 each to supply one-fourth unit of current to the collector electrodes of the transistors 44 and 43. These one-fourth units of current are summed in the emitter electrodes of the transistors 44 and 43 to produce a current I2 of one-half unit. Utilizing the equations set forth above for currents 11, 12 and 13, it will be seen that 13 equals one and one-half units of current causing two units of current to flow through the diode 47. Since each of the transistors 60 and 61 supplies the same level of static current, three-fourths unit of current flows through each of the resistors 62 and 63.

These current ratios are assured at different selected power supply levels and independent of wide variations in the selected power supply level.

It will be appreciated that the constant current I1 has been illustrated as being determined by the resistor 67 in FIG. 4 and in FIG. 1 by the resistor 18. It will be appreciated that other constant current sources may be utilized in place of the resistors. For example, one known constant current supply which can replace the resistors is a field effect transistor 70 (FIG. 4) of the insulated gate type which is operated in the enhancement mode. This field effect transistor type of constant current supply has the advantage that the current supplied does not vary with variations in the supply potential. Thus not only can the current ratios of I1, I2 and I3 be maintained constant with variations in the supply potential, but also the values of these currents can be maintained relatively constant with the use of the field effect transistor 70.

The values of the resistors 62 and 63 are selected so as to produce at output terminals 68 and 69 the desired operating potentials, for example ground potential.

The concept of using only transistor devices (except for the bias current source 67 or 70) to set all operating current levels in a differential amplifier is claimed generically in said first copending application of Greeson, Jr.

I claim:

1. A monolithically fabricated amplifier circuit of the type
in which first and second cascade-connected differential amplifier stages include respectively a first pair of transistors of one conductivity type having emitter and collector electrodes and a second pair of transistors of the opposite conductivity type having emitter and collector electrodes, and
in which a third amplifier having its output connected to the emitter electrodes of the first pair of transistors compares the level of a reference voltage means with a voltage produced across an impedance by the total collector current of the second stage flowing through the impedance and produces an output current for application to the emitter electrodes of the first stage as a function of the comparison,
wherein the third amplifier is characterized by a single transistor of said one conductivity type having its collector electrode connected to the emtter electrodes of said first pair of transistors, and having base and emitter electrodes,
wherein said impedance is characterized by at least one transistor of said one conductivity type having an emitter electrode and having its base-collector electrodes substantially short-circuited, the short-circuited electrodes being connected to the emitter electrode of said single transistor,
wherein impedance means couples the short-circuited electrodes to the collector electrodes of said second pair of transistors,
wherein the reference voltage means is characterized by a pair of series-connected transistors of said one conductivity type each having its base-collector electrodes substantially short-circuited, series-connected transistors being connected between the base electrode of said single transistor and the emitter electrode of said one transistor,
said series-connected transistors, said single transistor and said one transistor having substantially matched base-emitter voltage-current characteristics, and
a source of reference current connected to said series-connected transistors to cause current flow in the emitter electrodes of the first pair of transistors substantially in accordance with the equation $$I2^2+I2I3-I1^2=0$$

where I1, I2 and I3 are respectively the reference current, the current in the emitters of the first pair of transistors and the current in the collectors of the second pair of transistors.

2. The monolithically fabricated amplifier circuit of claim 1 further comprising
transistor amplifiers of said opposite conductivity type for supplying operating current to the collector electrodes of the first stage,
a predetermined number of additional transistors of said opposite conductivity type having base-emitter voltage-current characteristics substantially matching those of the transistor amplifiers, having their base-collector electrodes substantially short-circuited and the short-circuited electrodes being connected directly to the base electrodes of the transistor amplifiers and said additional transistors having their emitter electrodes connected directly to the emitter electrodes of the transistor amplifiers, said additional transistors connected to said source of reference current for producing a collector current in each transistor amplifier which is substantially equal to the value of the reference current divided by the number of additional transistors,
the emitter electrodes of said second pair of transistors being connected directly to a power supply for optimum dynamic range.

3. The amplifier of claim 1 together with
a pair of additional transistors of said opposite conductivity type each supplying current to the collector electrodes of the first pair of transistors, and having base and emitter electrodes,
a further transistor of said opposite conductivity type having base-emitter voltage-current characteristics substantially matching those of the additional transistors having its base-collector electrodes substantially short-circuited and the short-circuited electrodes being connected directly to the base electrodes of said additional transistors and said further transistor being connected to said source of reference current to set the base voltage of the additional transistors at a selected value, and
resistors of a predetermined value connected to the emitter electrodes of the additional transistors for causing the additional transistors to supply a selected current level to each collector electrode of the first pair of transistors in response to said selected value of base voltage,
the emitter electrodes of the second pair of transistors being connected directly to a power supply for optimum dynamic range.

4. A signal translating device comprising
electrical circuit means,
a semiconductor chip,
first and second transistors monolithically fabricated in one surface of the chip and connected in series, each having base, collector and emitter electrodes, the junction between said transistors connected to the electrical circuit means,
third and fourth transistors monolithically fabricated in said surface of the chip and connected in series, each having base, collector and emitter electrodes,
means on the chip substantially short-circuiting the base-collector electrodes of the second, third and fourth transistors,
the base-emitter voltage-current characteristics of first and third transistors substantially matching each other and those of the second and fourth transistors substantially matching each other,
the series-connected third and fourth transistors connected between the base electrode of the first transistor and the emitter electrode of the second transistor and poled for current flow in the same direction as the first and second transistors,
a source of reference current I1 external to the chip, and connected to the third and fourth transistors to establish across the third and fourth transistors a reference voltage which voltage is thereby established as a forward-biasing voltage from the base electrode of the first transistor to the emitter electrode of the second transistor producing current flow in the series-connected first and second transistors,
said electrical circuit means producing a current I3 at the junction between the first and second transistors for flow only through the second transistor to vary the level of the voltage across the second transistor as a direct function of the level and polarity of the current I3,
said variation in voltage level across the second transistor causing a variation in collector current flow I2 in the first transistor substantially in accordance with the equation $$I2^2+I2I3-I1^2=0$$

5. The signal translating device of claim 4
wherein the transistors are all of the same conductivity type, and
wherein the base-emitter voltage-current characteristics of all of the transistors substantially match each other.

(References on following page)

References Cited

UNITED STATES PATENTS

| | | | |
|---|---|---|---|
| 3,395,358 | 7/1968 | Petersen | 330—30 |
| 3,414,834 | 11/1968 | Stubbs | 330—69 |
| 3,434,069 | 3/1969 | Jones | 330—30 |
| 3,416,092 | 12/1968 | Frederiksen | 330—38X |
| 3,444,476 | 5/1969 | Leidich | 330—30X |

NATHAN KAUFMAN, Primary Examiner

U.S. Cl. X.R.

330—16, 38, 69